(12) United States Patent
Hong

(10) Patent No.: US 7,210,086 B2
(45) Date of Patent: Apr. 24, 2007

(54) LONG RUNNING TEST METHOD FOR A CIRCUIT DESIGN ANALYSIS

(75) Inventor: Eric Liau Chee Hong, Munich (DE)

(73) Assignee: Infineon Technologies AG, Munich (DE)

( * ) Notice: Subject to any disclaimer, the term of this patent is extended or adjusted under 35 U.S.C. 154(b) by 209 days.

(21) Appl. No.: 10/954,983

(22) Filed: Sep. 30, 2004

(65) Prior Publication Data

US 2005/0108608 A1  May 19, 2005

(30) Foreign Application Priority Data

Sep. 30, 2003  (EP) .................................. 03021995

(51) Int. Cl.
  *G01R 31/28* (2006.01)
  *G06F 11/00* (2006.01)
  *G06F 17/50* (2006.01)

(52) U.S. Cl. .................... 714/741; 714/37; 714/738; 716/4

(58) Field of Classification Search ..................... None
  See application file for complete search history.

(56) References Cited

U.S. PATENT DOCUMENTS

| 5,867,505 A | * | 2/1999 | Beffa ......................... 714/718 |
| 6,070,260 A | * | 5/2000 | Buch et al. .................. 714/731 |
| 6,098,186 A | | 8/2000 | Rivoir |
| 6,115,835 A | | 9/2000 | Nevill et al. |
| 6,347,386 B1 | | 2/2002 | Beffa |
| 6,622,270 B2 | * | 9/2003 | Beffa .......................... 714/718 |
| 6,651,202 B1 | * | 11/2003 | Phan .......................... 714/733 |
| 2005/0024074 A1 | * | 2/2005 | Benjamin et al. ........... 324/763 |

\* cited by examiner

*Primary Examiner*—Phung My Chung
(74) *Attorney, Agent, or Firm*—Slater & Matsil, L.L.P.

(57) ABSTRACT

The invention relates to a design analysis technique for a test pattern analysis of chips via automatic test equipment (ATE) or a circuit simulation to detect potential design weakness or abnormal behavior in real customer application faults. Problems are solved by comprising a simulation procedure stored in an LRT database of automatic test equipment (ATE), defining test conditions and test patterns which execute and generate continuously for a time given by a user, applying the test stimuli and test conditions to a device under test (DUT) and starting the long running test (LRT), stopping the test automatically if any application faults occur and logging the failure time and timely test sequence and starting another test again until a given maximum number of tests are reached.

9 Claims, 3 Drawing Sheets

LONG RUNNING TEST METHOD FOR A CIRCUIT DESIGN ANALYSIS

This application claims priority to European Patent Application 03021995.0, which was filed Sep. 30, 2003 and is incorporated herein by reference.

1. Technical Field

The invention is related to a long running test method to mimic real-device application testing for circuit design analysis and circuit simulation to detect and analyze potential design failures related to application faults such as functional, current, voltages using ATE (Automatic Test Equipment).

2. Background

Typical test pattern analysis via ATE or circuit simulation is very difficult to detect any potential design weakness or abnormal behavior in real customer application faults. In many cases, customers have a problem properly operating a chip even though the chip passed all tests in the producer's analysis lab.

Therefore, a major technical problem and challenge is how to perform a test or develop a technique that can cover, or at least close to, the test in real customer application via ATE or a complete circuit simulation based on the real customer application, but without using the real customer application setup, e.g., the hardware and the software.

In case there are known customer failures it is difficult to get any useful information to start an analysis. The application test only indicates whether or not the chip operates but not under what test conditions. Thus, gaining useful information usually depends on individual design analysis experiences, trial and error, plus a lot of time consuming discussions until the problem has been solved.

Many practical technical problems need to be solved by application fault analysis via a conventional way.

It is very difficult to localize the design weakness or faults due to application failures using circuit simulation depending on a small set of predefined trial error simulation patterns.

Very large, random, customer-like patterns are not practical for circuit simulation analysis. Furthermore, the typical runtime of ATE test patterns is not practical for circuit simulation analysis.

The typical runtime of ATE test patterns is short, typically less than a second or minutes. Therefore, the test can only represent a part of functional verification. It does not imply that the same test can survive in real application for a much longer time, such as "a same timely test sequence has been repeatedly executed" for more than a few hours instead of seconds or minutes.

The question is whether the chip will hang up after a few hours or whether the design is robust. It is not possible to see this behavior with the conventional ways of testing.

Another problem is that a typical application test approach requires that all customer-like hardware be set up in order to produce and study the behavior of the chip in a real application. But this test or analysis approach cannot actually show when the chip fails or how the chip fails.

U.S. Pat. No. 6,098,186 describes a test permutator. This method is selecting of permutations of a plurality of parameters, which is input test signal combination. This can be a group of single bits or just a single signal. The major challenge of this method is to solve the very large combination of input test signal combinations. The permutation sequence according to this method provides a excellent compromise between coverage and required time, since all parameters are varied concurrently. This method, however, cannot guarantee the coverage of all combinations including those potential worst case, critical or application failure related sequences. This is because the test permutator is only selecting of test with dedicated permutation based on the probability of each parameter variation.

U.S. Pat. No. 6,347,386 B1 describes a system for optimizing the testing and repair time of a defective integrated circuit. This method is designed to reduce the time to repair those repairable defective memory devices. The major idea of this system is to have a test identifier to identify which chip failed with what test and then extract them to re-test to confirm the failure, and finally to repair it if the chip is repairable.

The invention of U.S. Pat. No. 6,347,386 is to log a test identifier for all those pre-selected and defined tests using ATE test system. All tests are pre-loaded. Different chips could fail with any different predefined tests. Therefore, it is difficult to sort them later. The failed chip together with the failed test identifier is logged into a database but not the whole test sequence or test content or specific failure time. Thus, it is not common to log such a test sequence or test content or specific failure time at all, one of the major reasons is that because all of the tests are known and well-defined before pre-loaded into ATE.

The robustness of a chip was not tested (only functional testing) before shifting the engineering sample to the customer.

SUMMARY OF THE INVENTION

In one aspect, the invention prevents disadvantages of the prior art and provides an analysis technique to localize any design weakness or defaults due to application failures.

In another aspect, the invention provides an analysis technique that actually shows when the chip fails and how it fails.

In another aspect, the invention provides an analysis technique for a much longer test sequence.

For example, problems can be solved by using a simulation procedure stored in a long running test (LRT) database of automatic test equipment (ATE). Test conditions and test patterns are defined which execute and generate continuously for a time given by a user. The test stimuli and test conditions are applied to a device under test (DUT) and the long running test (LRT) is started. The test is stopped automatically if any application faults occur and the failure time and timely test sequence are logged. Another test can be started again until a given maximum number of tests are reached.

Before starting the test, a pre-check of robust pattern to the device under test can be applied and the output of the test results (pass or fail) under the same test conditions into the LRT database can be recorded.

The long running test is started with predefined long running test conditions, which are runtime and runtime-per-test.

A post-check of robust check pattern to the device under test can be applied after the LRT. The output of the test results (pass or fail) under the same test conditions are recorded into a final database.

The design defects or weaknesses due to application failures is identified by a small set of test patterns, test conditions, LRT failure time and robustness check.

The design defects and weaknesses based on LRT failure time and test sequence is finally localized by circuit simulation.

The invention solves technical problems mentioned in the prior art description by a long running test (LRT) concept. One concept of the LRT imitates the application test behavior and condition. All dedicated test conditions and test patterns are executing or generating continuously for a time given by a user.

The running time can be a few hours, days or a few minutes, seconds, etc. The testing time is similar to the application test so that if any application fault occurs, the test will automatically stop and log the failure time and timely test sequence.

Then, another test is started again until the maximum number of LRT is reached. The number of LRT's is also given by the user. Because all tests are running for some time, and mostly a long time like application tests, the new design analysis technique is called a long running test.

Such a similar application idea is integrated into ATE to detect a small set of timely test sequences and test conditions that cause potential application failures, and then this set of test patterns and test conditions are further analyzed by circuit simulation.

Such a scheme can efficiently identify defects and weaknesses due to application failure as well as locate the defects or weaknesses within a design in a much shorter time compared to the typical way according the prior art. This is the major advantage of the invention, while conventional ways of testing cannot handle such a problem systematically and efficiently.

BRIEF DESCRIPTION OF THE DRAWINGS

The invention is described with an example now. The accompanying drawings show.

DETAILED DESCRIPTION OF ILLUSTRATIVE EMBODIMENTS

Figure 1:
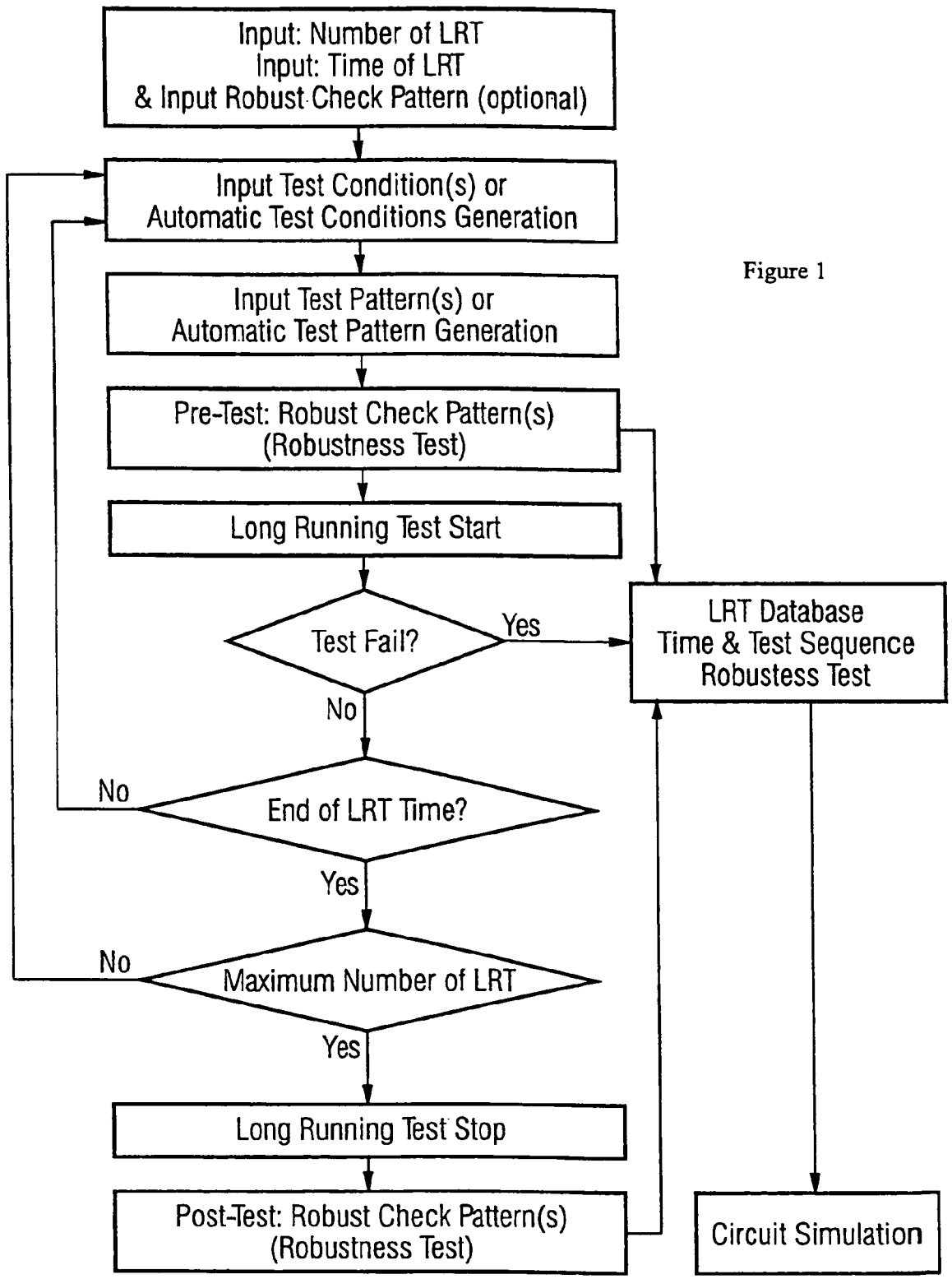
FIG. 1 is a schematic diagram with the several steps of the LRT technique for robust and application analysis.

Referring now to FIG. 1, a flowchart shows the LRT runtime, the LRT loops, the test condition generation and the test pattern generation. After that, test stimuli (test pattern) and test conditions via the automatic test equipment (ATE) based or any other measurement system can be generated.

In the next step the test stimuli and test conditions are applied to a device under test (DUT).

Optionally, a pre-check of robust check pattern can be applied to the device under test (DUT) and the output of the test results (e.g., pass or fail) under the same test conditions can be recorded into an LRT database.

Next, the long running test (LRT) with the predefined conditions (e.g., number of LRT runtime and runtime-per-test) begins and is monitored to see if the long running test sequence fails. If so, the time and test sequence are recorded into the LRT database when the test fails.

The system then monitors to see if the end of the LRT time is found and, if so, the ATE pattern generator is shut down. (ATE may hang up if running continuously without proper control procedures.) Otherwise the foregoing steps are repeated until the end of the LRT time and the end of the LRT loop. The LRT is stopped if the end of the LRT time and the end of the LRT loop.

After the end of the LRT, a post-check of robust check pattern can optionally be applied to the device under test (DUT) and the output of the test results (pass or fail) under the same test conditions can be recorded into the final database.

From the LRT database, if the pre- and the post-check works even if the LRT failed, means design does not hang up. If the pre-check passes and post-check fails because the LRT failed, means it is a very high possibility that the chip will hang up after the long running test. That means that the chip may break down some time in real application.

Finally, a small set of test patterns (worst case timely test sequence with respect to LRT failure), test conditions, LRT failure time and robustness check, are used to identify the design defects or weaknesses due to application failures.

Circuit simulation analysis is at least based on the foregoing information to localize the design defects and weaknesses including wafer probing internal signal with respect to worst case test pattern and condition.

Embodiments of the present invention have advantages over prior art systems. One major challenge addressed by embodiments of the present invention is to deal with the real DUT functional failure and real device application failure using an ATE analysis method and later circuit-simulation. This method does not require any application board, but it is able to detect and analyze the potential real-device-application failure efficiently.

The state of the art uses a set of different application board testing to analyze the failure. This approach takes very huge effort and time to reach the conclusion. Moreover, an application board is expensive and difficult to get and can take a few months to obtain it. Thus, ATE (test system) is only an option to perform a real-chip analysis in the early phase of circuit-analysis. It also means a special set of tests with dedicated permutation can pass, and later fail in real-application. In this case, it is not interesting how to obtain a set of tests with special permutation at all. However, an object of the preferred embodiment of the invention is to create an ATE analysis platform, which is able to simulate the real-device-application platform. If any functional failure is detected, then it will be extracted and analyzed with ATE and circuit-simulator.

Figure 2A:
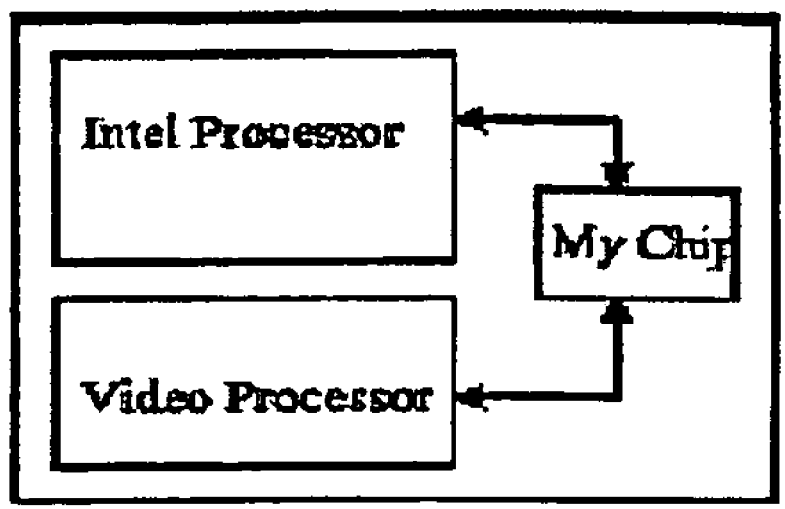
FIG. 2a is an example of an application test board.
Figure 2B:
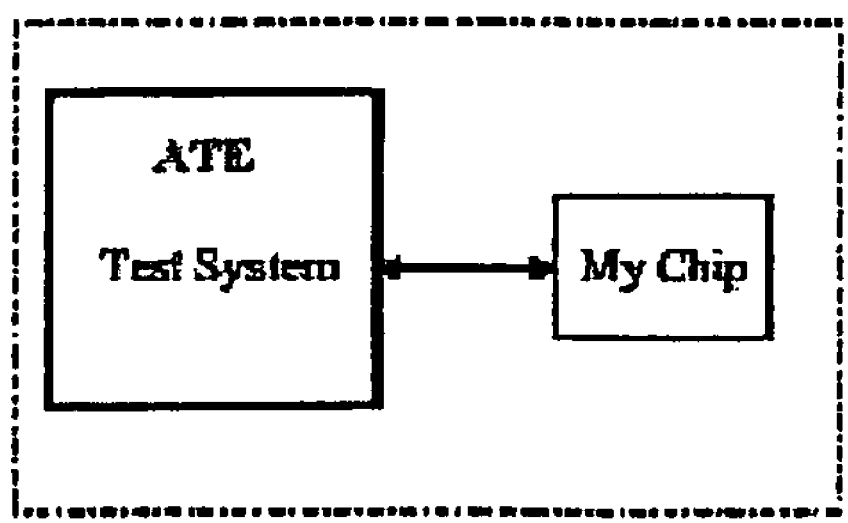
FIG. 2b is a typical ATE test system to DUT.

FIG. 2a shows an example of an application test board and FIG. 2b shows a typical test system to DUT. The major difference between FIGS. 2a and 2b is that the processor in the application board generates all different random kinds of valid sequences to "my chip," and "my chip" will respond with an expected correct signal back to processor. The ATE can only pre-load a set of pre-selected or defined tests, and they are further limited by their size due to the limited test system vector memory. ATE tests "my chip" with a set of tests (they are normally very fast, less than a second) in comparison to the application test, which is normally long, such as 24 hours continuously running with all different (any valid sequence) sequences. That is the major reason why a passed chip from ATE could still later fail in the application. It's just because all 24 hours combination cannot covered with just a set of pre-selected (very fast and short) test using ATE.

To create an ATE-like application test such that the results of using FIG. 2a are the same as FIG. 2b, the present invention develops the plug-in ATPG (Automatic Test Pattern Generator) unit with ATE (see FIG. 3) for the long running test, so that ATE can behave like the processor, which is able to interface with "my chip" for unlimited time (also means unlimited number of cycles).

This method is also flexible to enter any pre-selected pattern, thus—this is what is meant by the inventor—execute and generate continuously for a time given by a user. It means unlimited cycle length with all different sequence-like application, it can be 2 hours, or 2 days, etc. The termination criteria are either the time of LRT (e.g., 3 days), functional failure (application related), or excessive power consumption or excessive voltage drop. It depends on the analysis purpose. LRT is just a general method, which is able to apply for any analysis topics.

Test failures can be from the test of any analysis measurement. The approach according this embodiment is practical and efficient. Long running test means run a test for a longer time like a real-application (such as one turns on a TV for 10 hours). It is clear that a test-permutator cannot handle this problem practically, as the basic concept and problem is already different.

A typical ATE can only pre-load a set of predefined test patterns and execute them in the flow. In the present invention, it is proposed to modify the content of the ATE vector memory with respect to each test point continuously. Each test point means the number of pattern cycle or time for testing. This is an interactive process that allows unlimited length of pattern testing without any test data compaction techniques, selected worst-case patterns are then encoded into long integer codes and saved in the hard-disk.

Figure 3:
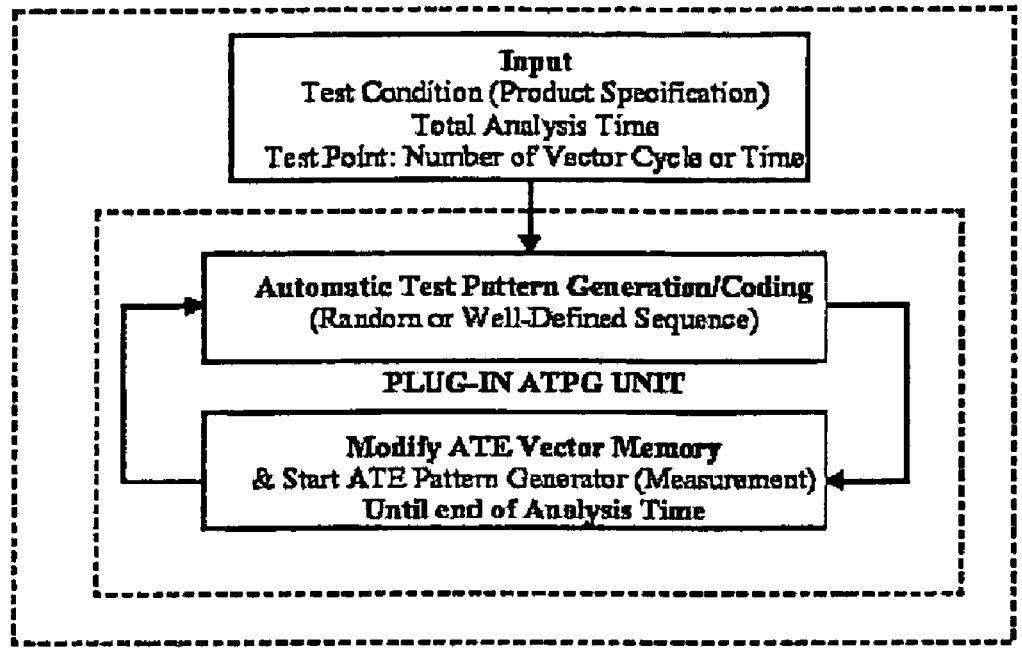
FIG. 3 shows a plug-in ATPG unit with industrial ATE.

This pattern code can be easily decoded into ATE vector memory on the fly for re-usability without re-loading the test program at all. Thus, it works just like the PLUG-IN UNIT, and can be adapted to different device's input configurations, and most of the industrial ATE. The complete concept of plug-in ATPG unit with industrial ATE can be described as follows and as shown in FIG. 3.

(1) Input AC (timing)/DC (level) test conditions (product specification) to ATE
(2) Input the total analysis time
(3) Input size of the test pattern to be analyzed. For example, testing every 1000 vector cycles with 85 ns, this also means 85 ns for each test point.
(4) Test pattern generation and coding (random or well-define sequence) based on its test point configuration (3).
(5) Modify ATE vector memory with respect to previous test pattern generation (4) and then start ATE pattern generator.
(6) Perform the measurement (power consumption) with respect to vector memory content, then back to (4) until end of (2).

Figure 4:
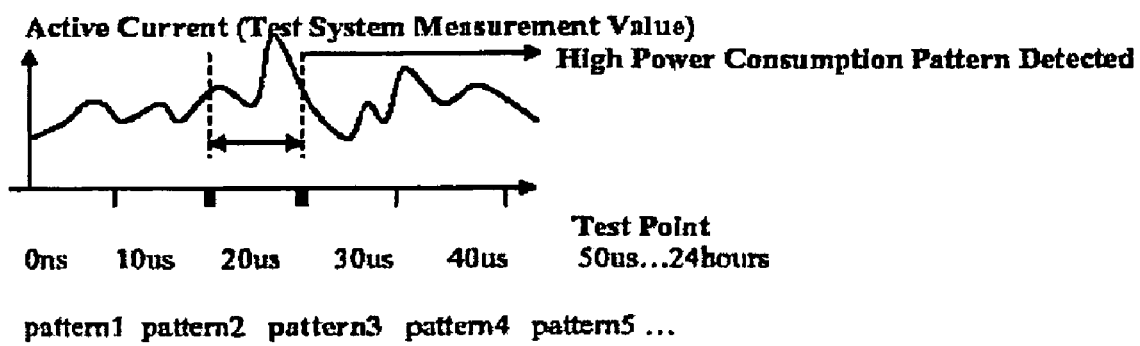
FIG. 4 shows a long running test approach to study the power consumption characteristics of the device.

In long running analysis with an ATE approach, the long analysis time sequence T is broken down into small test pattern sequences in time domain as shown in FIG. 4.

Each test pattern has a length of D=T/S, where S is test point chosen based on the required analysis resolution D, means number of small pattern sequence. For example, assume a device is running at 50 MHz and 20 ns clock period and analysis pattern sequence is 200 cycles. The total analysis time is 1 hour or 3600 seconds. So, that can be computed by 20 ns×200 cycles=4 Sµs. Thereby D=T/S would be 3600 s/4 µs=900,000,000 pattern sequences with 200 cycles and 20 ns clock period each. This set of analysis patterns can never be achieved by any full-chip simulation or typical ATE approach. Moreover, the larger of D leads to higher analysis resolution and D can increase due to T increase.

An example will now be described. The experimental results demonstrate that the invention is proved to be much more efficient to detect potential application failure compared to conventional ways of testing. The general concept of the invention as shown in the accompanying drawings can be implemented into any ATE or measurement system.

In order to imitate an application test, the test conditions are defined with customer requirements to screen out the first design engineering sample (ES).

Such test conditions are a three core of power supply, e.g., 1.7 V (low), 1.8 V (norm) and 1.95 V (high). TRC (device row cycle time) is 70 nsec, test pattern with refresh logic turns on and off and each LRT with a dedicated power supply level runs continuously for 3 hours.

The tested chip hangs on less than 30 seconds at a low power supply level of 1.7 V with refresh on, it is provided by post test robust pattern failed at all data output bus are actually stuck at some values while other command signals hang up at some states. The chip does not hang up at a low power supply level of 1.7 V with refresh off.

The internal signals probing on wafer using a small set of worst case patterns and conditions from the invention. There was localized some of the important signal closed to one of the access state machine. All of this information is then converted into circuit simulation. The result of the circuit simulation is that the major root cause for hang up is because one of the access signals collides with possible refresh signals, thus the state machine could not decide which action to perform.

If a calculation is done of how generate a 40 second pattern (random or any) using application spec TRC 70 nsec (means every vector is 70 nsec) to capture such a fault, it is immediately realized that the size of the test pattern is not possible to achieve, or none of the pattern generator can handle such a big pattern. It could take a few days to generate only one single pattern. Moreover, 30 seconds is just one of the values for a design or chip, may be some other test or chip fail after 1 hour or 2 hours, etc. Therefore, the LRT is so important in this particular analysis phase.

What is claimed is:

1. A long running test method to mimic real-device application testing for circuit design analysis and circuit simulation to detect and analyze potential design failure related to application faults ATE (Automatic Test Equipment), the method comprising:

defining test conditions and generating a long running test that includes an all different valid random sequence, the long running test using Plug-in-ATPG to repeatedly modify the parameter of the preselected and defined tests performed on ATE to mimic a long duration user application;

applying said long running test and test conditions to a device under test (DUT);

stopping the long running test automatically if either (1) an end of the long running test is determined or (2) a test fails; and upon determining that a test fails, logging a timely test sequence and failure time and then re-starting another long running test again until the end of a number of long running tests.

2. The method of claim 1 and further comprising applying a pre-check of robustness check pattern to the device under test (DUT) and recording the output of the test results under the same test condition into the long running test LRT database.

3. The method of claim 1 and further comprising starting the long running test with predefined long running test (LRT) conditions.

4. The method of claim 3 wherein the predefined long running test (LRT) conditions are the number of long running test (LRT) and running time of the test sequence per test.

5. The method of claim 1 and further comprising applying a post-check of robustness check pattern to the device under test (DUT) and recording the output of the test results under the same test condition into a final database.

6. The method of claim 1 and further comprising identifying design defects or weaknesses due to application failures by a small set of test pattern, test condition, long running test (LRT) failure time and robustness check.

7. The method of claim 6 and further comprising localizing the design defects or weaknesses based on long running test (LRT) failure time and test sequence by circuit simulation.

8. The method of claim 1 wherein said test method detects functional, current and voltage faults.

9. A long running A long running test method to mimic real-device application testing for circuit design analysis and circuit simulation to detect and analyze potential design failure related to application faults using ATE (Automatic Test Equipment), the method comprising:

defining test conditions and generating a long running test that includes an all different valid random sequence, the long running test based upon a user-like application test using Plug-In-ATPG on ATE platform technique;

applying a pre-check of robustness check patterns to the device under test DUT and recording the output of the test;

applying said long running test and test conditions to a device under test;

applying a post check of robustness check patterns to the device under test and recording the outputs of the test results;

stopping the long running test automatically if either (1) an end of the long running test is determined or (2) a test fails; and upon determining that a test fails, logging a timely test sequence and failure time and then re-starting another long running test again until the end of a number of long running tests.

* * * * *